United States Patent
Lunden et al.

(10) Patent No.: US 9,847,856 B2
(45) Date of Patent: Dec. 19, 2017

(54) APPARATUS AND METHOD FOR TIME DOMAIN ICIC WITH MUTING PATTERN COMPRISING FIXED AND OPTIONAL PARTS

(71) Applicant: Nokia Corporation, Espoo (FI)

(72) Inventors: Jari Petteri Lunden, Espoo (FI); Elena Virtej, Espoo (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 117 days.

(21) Appl. No.: 14/350,939

(22) PCT Filed: Oct. 22, 2012

(86) PCT No.: PCT/FI2012/051010
§ 371 (c)(1),
(2) Date: Apr. 10, 2014

(87) PCT Pub. No.: WO2013/060931
PCT Pub. Date: May 2, 2013

(65) Prior Publication Data
US 2014/0269598 A1    Sep. 18, 2014

Related U.S. Application Data

(60) Provisional application No. 61/550,544, filed on Oct. 24, 2011.

(51) Int. Cl.
*H03G 3/34* (2006.01)
*H04L 5/00* (2006.01)
(Continued)

(52) U.S. Cl.
CPC .......... *H04L 5/0032* (2013.01); *H03G 3/345* (2013.01); *H04L 5/0035* (2013.01);
(Continued)

(58) Field of Classification Search
CPC . H04W 76/046; H04B 7/0417; H04B 7/0632; H04J 11/0023; H04L 5/0057; H04L 1/0008; H04N 3/24; H03G 3/345
See application file for complete search history.

(56) References Cited

U.S. PATENT DOCUMENTS

2009/0296643 A1    12/2009  Cave et al.
2011/0039583 A1    2/2011   Frank et al.
(Continued)

OTHER PUBLICATIONS

"Signalling support for Almost Blank Subframe patterns", 3GPP TSG-RAN WG2 Meeting #72, R2-106449, Agenda item: 7.6.1.1, Alcatel-Lucent, Nov. 15-19, 2010, pp. 1-5.*
(Continued)

*Primary Examiner* — Salvador E Rivas
(74) *Attorney, Agent, or Firm* — Squire Patton Boggs (US) LLP

(57) ABSTRACT

According to an example embodiment of this invention, a method may include by a processor, receiving a configuration of a flexible muting pattern, wherein the muting pattern comprises a fixed part and an optional part; determining to activate the optional part of the flexible muting pattern; and preparing a message indicating to a network element that the optional part of the flexible muting pattern is activated. Apparatus and computer readable media are also described.

20 Claims, 6 Drawing Sheets

(51) Int. Cl.
    H04W 72/12      (2009.01)
    H04L 1/00       (2006.01)
    H04W 16/14      (2009.01)
    H04W 28/06      (2009.01)
    H04J 11/00      (2006.01)

(52) U.S. Cl.
    CPC ...... H04W 72/1215 (2013.01); H04J 11/0023 (2013.01); H04L 1/0008 (2013.01); H04W 16/14 (2013.01); H04W 28/06 (2013.01)

(56) References Cited

U.S. PATENT DOCUMENTS

| | | |
|---|---|---|
| 2011/0081933 A1 | 4/2011 | Suh et al. |
| 2011/0230144 A1 | 9/2011 | Siomina et al. |
| 2012/0046030 A1 | 2/2012 | Siomina et al. |
| 2013/0329636 A1* | 12/2013 | Jiang .................. H04W 48/16 370/328 |

OTHER PUBLICATIONS

"RRC Signalling Design for Almost Blank Subframe Patterns", 3GPP TSG-RAN WG2 Meeting #72, R2-106451, Agenda item: 7.6.2, Alcatel-Lucent, Nov. 15-19, 2010, pp. 1-7.*

"Need for ABS patterns for CQI measurements", 3GPP TSG-RAN WG2 Meeting #72, R2-106453, Agenda item: 7.6.1.1, Alcatel-Lucent, Nov. 15-19, 2010, pp. 1-3.*

R2-106451, "RRC Signalling Design for Almost Blank Subframe Patterns", Nov. 15-19, 2010, pp. 1-7.*

R2-106453, "Need for ABS patterns for CQI measurements", Nov. 15-19, 2010, pp. 1-3.*

3rd Generation Partnership Project; "Technical Specification: LTE; Evolved Universal Terrestrial Radio Access (E-UTRA) and Evolved Universal Terrestrial Radio Access Network (E-UTRAN); Overall description; Stage 2 (Release 10)", TS 36.300, V.10.4.0, Jun. 2011, pp. 1-207.*

R2-106419, "eICIC ABS patterns", Nov. 15-19, 2010, pp. 1-4.*

"3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 10)", 3GPP TS 36.300, V10.5.0, Sep. 2011, pp. 1-194.

Extended European Search Report received for corresponding European Patent Application No. 12843765.4, dated Apr. 30, 2015, 7 pages.

International Search Report and Written Opinion received for corresponding Patent Cooperation Treaty Application No. PCT/FI2012/051010, dated Jan. 29, 2013, 13 pages.

Wang et al., Time and Power Domain Interference Management for LTE Networks with Macro-Cells and HeNBs', Vehicular Technology Conference (VTC Fall), 2011 IEEE, Sep. 5, 2011, Aalborg East—Denmark, 6 pages.

* cited by examiner

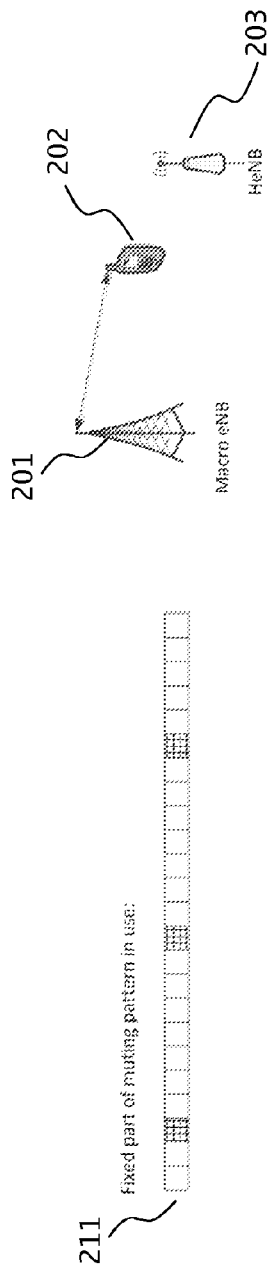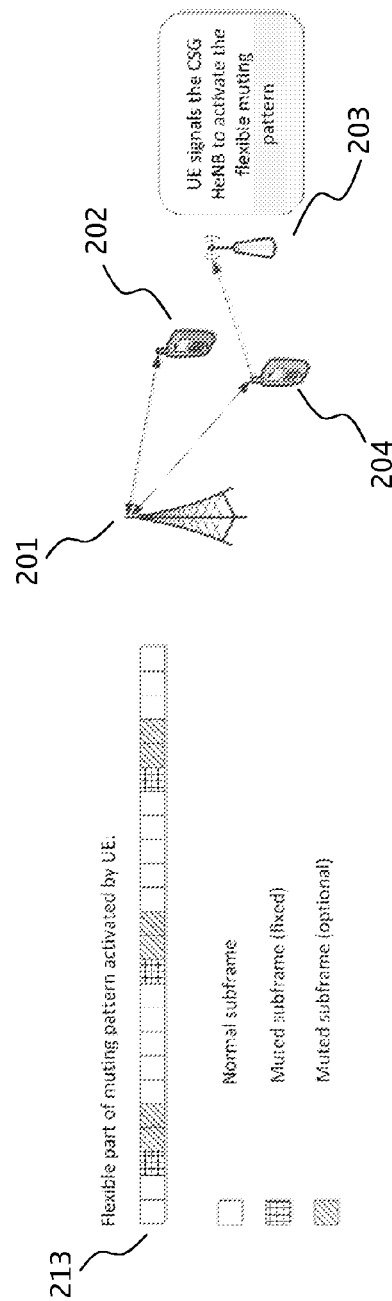
Figure 2A
Figure 2B

APPARATUS AND METHOD FOR TIME DOMAIN ICIC WITH MUTING PATTERN COMPRISING FIXED AND OPTIONAL PARTS

RELATED APPLICATION

This application was originally filed as Patent Cooperation Treaty Application No. PCT/FI 2012/051010 filed Oct. 22, 2012 which claims priority benefit to U.S. Provisional Patent Application No. 61/550544; filed Oct. 24, 2011.

TECHNICAL FIELD

The exemplary and non-limiting embodiments of this invention relate generally to an apparatus, a computer program and a method for time domain (TDM) inter-cell interference coordination (ICIC) with flexible muting pattern comprising fixed and optional parts.

BACKGROUND

This section is intended to provide a background or context to the exemplary and non-limiting embodiments of this invention that are recited in the claims. The description herein may include concepts that could be pursued, but are not necessarily ones that have been previously conceived, implemented or described. Therefore, unless otherwise indicated herein, what is described in this section is not prior art to the description and claims in this invention.

In wireless communication, different collections of communication protocols are available to provide different types of services and capabilities. The long term evolution (LTE) is one of such collection of wireless communication protocols that extends and improves the performance of existing UMTS (universal mobile telecommunications system) protocols and is specified by different releases of the standard by the $3^{rd}$ generation partnership project (3GPP) in the area of mobile network technology.

Of interest herein are the further releases of 3GPP LTE targeted towards future international mobile telephony-advanced (IMT-A) systems, referred to herein for convenience simply as LTE-Advanced (LTE-A). A goal of LTE-A is to provide significantly enhanced services by means of higher data rates and lower latency with reduced cost. LTE-A is directed toward extending and optimizing the current 3GPP LTE radio access technologies to provide higher data rates at very low cost. LTE-A will be a more optimized radio system fulfilling the international telecommunication union radiocommunication sector (ITU-R) requirements for IMT-A while maintaining backward compatibility with the current LTE release.

Both time-division duplexing (TDD) and frequency-division duplexing (FDD) schemes are adopted in LTE. In LTE TDD scheme, the downlink (DL) transmission (from the network to the user equipment) and the uplink (UL) transmission (from the user equipment to the network) are operated at the same carrier frequency, but are allocated to different time portions, or the so-called subframes. In LTE-A, several UL/DL subframe configurations are available for semistatic selection according to the ratio of UL and DL data. Recently, dynamic allocation of subframes to UL or DL is considered.

The concept of a heterogeneous network has attracted considerable attention to optimizing performance, particularly for unequal user or traffic distribution. In a heterogeneous network, different layers of cells are deployed in a less well planned or even uncoordinated manner. To combat with the challenge of interference management, different inter-cell interference coordination (ICIC) technologies are studied, one of which is the time domain (TDM) ICIC. The general description of TDM ICIC can be found in 3GPP, "*TS 36.300 Evolved Universal Terrestrial Radio Access (E-UTRA) and Evolved Universal Terrestrial Radio Access Network (E-UTRAN); Overall description; Stage 2*", v10.5.0 (2011 September), subclause 16.1.5, attached as Appendix A. In TDM ICIC, interference coordination is based on muting subframes. The muting is accomplished by using almost blank subframes (ABS) or multimedia broadcast multicast service single frequency network (MBSFN) subframes with a periodic pattern. Almost blank subframes are subframes with reduced transmit power, including no transmission, on some physical channels and/or reduced activity. TDM ICIC is mainly aimed for interference scenarios between macro evolved NodeB (eNodeB or eNB) and CSG (closed subscriber group) home eNode B (HeNB), and between macro eNodeB and pico eNodeB, but the muted subframes could be used for HeNB-HeNB interference management purposes as well.

SUMMARY

Various aspects of examples of the invention are set out in the claims.

According to a first aspect of the present invention, a method may include by a processor, receiving a configuration of a flexible muting pattern, wherein the muting pattern comprises a fixed part and an optional part; determining whether to activate the optional part of the flexible muting pattern; and preparing a message indicating to a network element that the optional part of the flexible muting pattern is activated.

According to a second aspect of the present invention, an apparatus may include at least one processor, and at least one memory including computer program code, wherein the at least one memory and the computer program code configured to, with the at least one processor, cause the apparatus to receive a configuration of a flexible muting pattern, wherein the muting pattern comprises a fixed part and an optional part; determine whether to activate the optional part of the flexible muting pattern; and prepare a message indicating to a network element that the optional part of the flexible muting pattern is activated.

According to a third aspect of the present invention, a computer program product comprising a computer-readable medium bearing computer program code embodied therein for use with a computer, the computer program code may include code for receiving a configuration of a flexible muting pattern, wherein the muting pattern comprises a fixed part and an optional part; code for determining whether to activate the optional part of the flexible muting pattern; and code for preparing a message indicating to a network element that the optional part of the flexible muting pattern is activated.

According to a fourth aspect of the present invention, an apparatus may include a means for receiving a configuration of a flexible muting pattern, wherein the muting pattern comprises a fixed part and an optional part; a means for determining whether to activate the optional part of the flexible muting pattern; and a means for preparing a message indicating to a network element that the optional part of the flexible muting pattern is activated.

According to a fifth aspect of the present invention, a method may include by a processor, configuring a flexible muting pattern, wherein the muting pattern comprises a fixed part and an optional part; and receiving a message indicating that the optional part of the flexible muting pattern is activated.

According to a sixth aspect of the present invention, an apparatus may include at least one processor, and at least one memory including computer program code, wherein the at least one memory and the computer program code configured to, with the at least one processor, cause the apparatus to, configure a flexible muting pattern, wherein the muting pattern comprises a fixed part and an optional part; and receive a message indicating that the optional part of the flexible muting pattern is activated.

According to a seventh aspect of the present invention, a computer program product comprising a computer-readable medium bearing computer program code embodied therein for use with a computer, the computer program code may include code for configuring a flexible muting pattern, wherein the muting pattern comprises a fixed part and an optional part; and code for receiving a message indicating that the optional part of the flexible muting pattern is activated.

According to a eighth aspect of the present invention, an apparatus may include a means for configuring a flexible muting pattern, wherein the muting pattern comprises a fixed part and an optional part; and a means for receiving a message indicating that the optional part of the flexible muting pattern is activated.

According to a ninth aspect of the present invention, a method may include by a processor, obtaining a configuration of a flexible muting pattern, wherein the muting pattern comprises a fixed part and an optional part; and sending a message indicating the configuration of the flexible muting pattern to a user equipment.

According to a tenth aspect of the present invention, an apparatus may include at least one processor, and at least one memory including computer program code, wherein the at least one memory and the computer program code configured to, with the at least one processor, cause the apparatus to, obtain a configuration of a flexible muting pattern, wherein the muting pattern comprises a fixed part and an optional part; and send a message indicating the configuration of the flexible muting pattern to a user equipment.

According to a eleventh aspect of the present invention, a computer program product comprising a computer-readable medium bearing computer program code embodied therein for use with a computer, the computer program code may include code for obtaining a configuration of a flexible muting pattern, wherein the muting pattern comprises a fixed part and an optional part; and code for sending a message indicating the configuration of the flexible muting pattern to a user equipment.

According to a twelfth aspect of the present invention, an apparatus may include a means for obtaining a configuration of a flexible muting pattern, wherein the muting pattern comprises a fixed part and an optional part; and a means for sending a message indicating the configuration of the flexible muting pattern to a user equipment.

The aspects of the invention as set out herein above and in the accompanying independent claims may be suitably combined with each other and with any of the embodiments described herein below and in the dependent claims in any manner apparent to one of ordinary skill in the art.

BRIEF DESCRIPTION OF THE DRAWINGS

For a more complete understanding of example embodiments of the present invention, reference is now made to the following descriptions taken in connection with the accompanying drawings in which:

FIGS. 2A and 2B illustrate the activation of the optional part of the muting pattern in accordance with an example embodiment of the invention;

DETAILED DESCRIPTION

Figure 1:
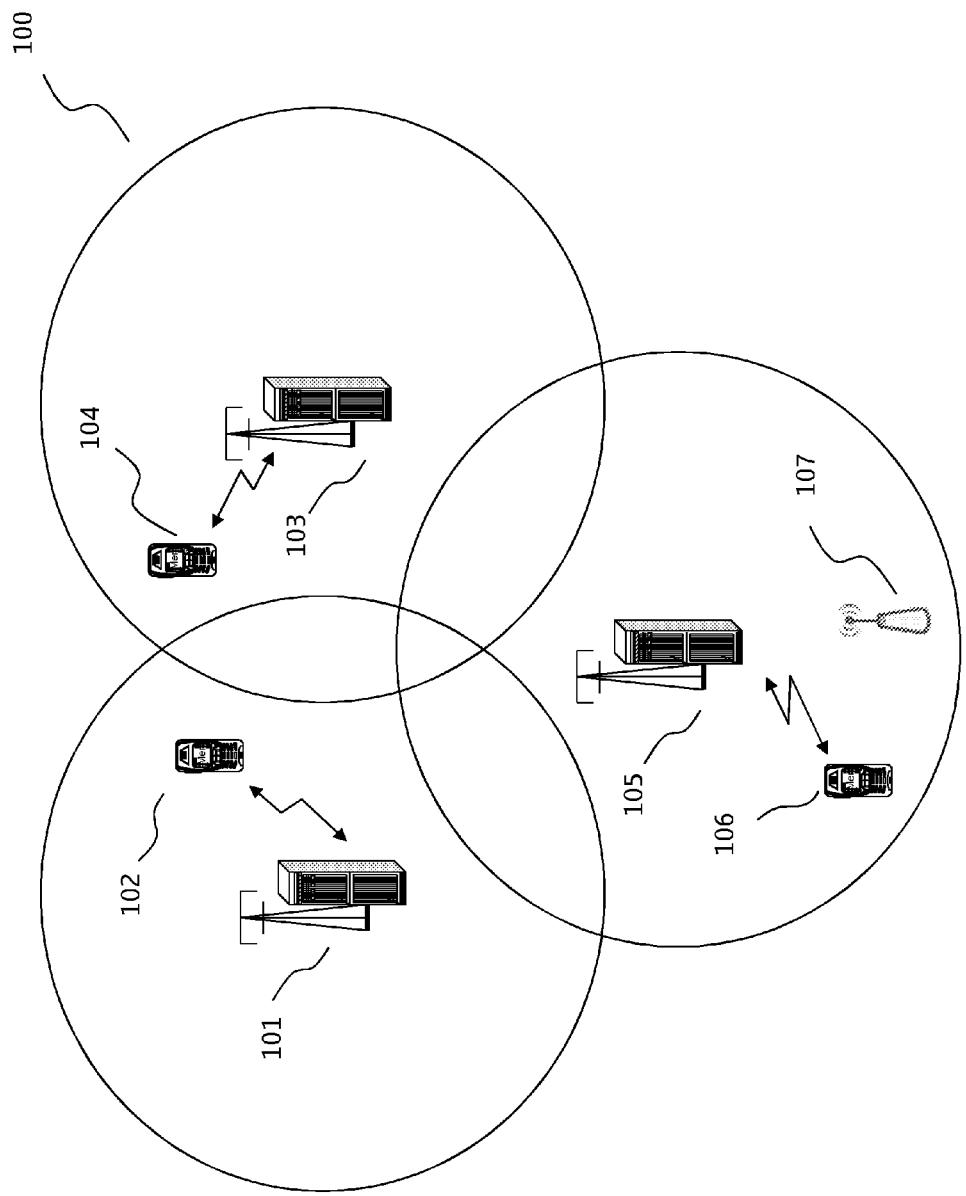
FIG. 1 illustrates an example wireless system in accordance with an example embodiment of the invention.

FIG. 1 illustrates an example wireless system 100 in accordance with an example embodiment of the invention. The example wireless system 100 comprises three $3^{rd}$ generation partnership project (3GPP) evolved NodeBs (eNBs) 101, 103 and 105, each communicating with a user equipment (UE) 102, 104 and 106, respectively. Although three eNBs and just one UE for each eNB are shown in FIG. 1, the example wireless system 100 may comprise more or less eNBs and more UEs for each eNB.

Recent interest in the telecommunications industry has focused on the femto-cell that is defined as low-cost, low-power cellular NodeB designed for use in residential or small business environment. The customer may deploy the femto-cell in locations where the coverage of a normal NodeB is weak or absent, or more capacity is desired. In FIG. 1, one such femto-cell NodeB 107, normally named as Home eNB (HeNB), is shown inside the coverage area of eNB 105. Accordingly, the normal eNBs 101, 103 and 105 are referred to as macro eNBs. Although one HeNB is present in FIG. 1 for illustration purpose, numerous HeNBs may be deployed in the example wireless system 100.

In an open access deployment scenario, a HeNB is enabled to serve any UE in the same way as a macro eNB, while a HeNB of a closed subscriber group (CSG) only serves limited UEs that are members of the CSG. In an example embodiment illustrated by FIG. 1, the HeNB 107 may employ the same frequency band as the macro eNB 105 for the purpose of high frequency use efficiency. When the macro UE 106 travels close to the HeNB 107 but does not belong to the CSG of HeNB 107, interference may occur.

In an example embodiment, the interference between macro eNB and CSG HeNB may be coordinated based on muting subframes. Being almost "silent" during the muting subframes, the HeNB, e.g., the HeNB 107 of FIG. 1, provides a chance for the victim eNBs, e.g., the macro eNB 105 of FIG. 1, to serve their UEs suffering from severe interference from the HeNB in these subframes, e.g., the UE 106 of FIG. 1. In other words, the HeNB may use configured muting patterns to reduce interference towards macro UEs that are not allowed to connect to the HeNB, e.g., due to CSG limitation. By default, the HeNB is muting transmission during the fixed part of the pattern, allowing interfered macro UEs to be served during the muted subframes.

In an example embodiment, a muting pattern comprises two parts. One part of the pattern is active by default and the other part is activated only when requested by a UE. We refer to the former part as the fixed part and refer to the latter part as the optional part for simplicity. In an example embodiment, the optional part of the pattern is requested by a UE signaling the interfering CSG HeNB. The fixed part used by the HeNB provides quick access to the macro cell and supports legacy UEs that are not able to request additional muting pattern. The fixed part may be stand-alone, e.g., for system information broadcast reception, paging channel, etc., the optional part may assume that there is also the fixed part so that it may be configured more flexibly. In an example embodiment, as an extension there may be multiple optional parts that are separately activated by request on a need basis. The signaling to activate the optional part may be initiated by the UE as well as by the network.

In an example embodiment, the muting pattern comprising a fixed part and an optional part is configured for the HeNBs by the network, for example, by macro eNBs 101, 103 and 105 of FIG. 1. In another example embodiment, the muting pattern is statically configured by an operations, administration, and maintenance (OAM) entity and is signaled to the macro eNBs so that they know when to schedule their interfered UEs, and to HeNBs so that they know when to mute their transmission.

The operator may decide the balance between the fixed part and the optional part based on its needs. In an example embodiment, the resulting flexible pattern may have more muted subframes than a fixed pattern would have. This is because the optional part of the pattern is active only part of the time (when needed) and hence the average impact to the CSG HeNB is less than the full extent of the pattern.

In an example embodiment, if the muting pattern comprising fixed and optional parts is configured to be the same in more than one CSG HeNBs within the same area, e.g., a macro eNB coverage area, the interference situations where multiple HeNBs significantly contribute to the interference experienced by a UE may be solved by independently activating the optional part of the muting pattern in those HeNBs without further coordination of muting patterns.

In an example embodiment, a UE may signal an interfering HeNB to activate the optional part of the muting pattern. This signaling may be autonomously triggered by the UE or initiated by a macro eNB serving the UE. One reasonable way to implement this signaling is to use the random access procedure of LTE system. In an example embodiment, a new event may be introduced in the random access procedure for this purpose. In another example embodiment, a new random access procedure message may be introduced. In another example embodiment, a new EstablishmentCause value may be introduced in the radio resource control (RRC) connection request message.

In an example embodiment, the signaling from a UE to activate the optional part of the muting pattern may cause a HeNB to take the optional part of the muting pattern into use for a specified duration, after which the signaling may need to be repeated. In an example embodiment, successive signallings may cause the duration to be extended. For example, instead of 1 minute, the duration will be 2 minutes and so on until a maximum duration is reached. The duration may start from the initial 1 minute again if no further request is received during a certain time, e.g., 10 minutes or a variable time depending on the duration of the previous request.

In an example embodiment, a HeNB may keep the optional part muted by default and is allowed to start transmitting during it when load conditions demand this. If a UE requests the HeNB to mute the optional part of the pattern, the HeNB will halt the transmission for a certain duration.

In an example embodiment, a HeNB may be configured to obey the request from a UE for activating the optional part of the muting pattern. In another example embodiment, a HeNB may send a confirmation message to the UE to acknowledge that the request for activating the optional part of the muting pattern has been correctly received. In another example, a HeNB may reject the request from a UE for activating the optional part and send a negative acknowledgement message to the UE.

In an example embodiment, a UE may determine to activate the optional part of the muting pattern based on the detection that the UE is being interfered by a CSG HeNB that the UE cannot access. For example, based on signal measurements, the UE observes that it is experiencing a low signal quality in the subframes that are not muted. In an example embodiment, the low signal quality may be a low reference signal received quality (RSRQ) of the macro cell that the UE is communicating with, especially, if this holds in the muted subframes, or a low RSRQ and at the same time a high reference signal received power (RSRP) of the macro cell that the UE is communicating with, or a high reference signal received power (RSRP) of the non-allowed interfering CSG HeNB.

In an example embodiment, other possible criteria for triggering the activation of the optional part may include recently received traffic in terms of data rate or resource blocks scheduled for the user. This information is available to both the UE and the network. Thus, if both sides are aware of the triggering criteria, the network may know when the UE will need to receive during optional part of the pattern, i.e., when the triggering conditions are met. In such a case, the network, e.g., the macro eNB, may assume that the terminals with sufficient capability can activate the optional part of the pattern when in a coverage hole caused by a CSG HeNB and can fulfill the other triggering criteria. Alternatively, explicit signaling may take place. For example, an event report triggered by a UE due to the coverage hole may cause the network (e.g., macro eNB) to signal the interfering (i.e., reported) HeNB to activate the optional part of the muting pattern, or the event report may contain an indication whether the UE has requested the optional part of the muting pattern to be activated from interfering cells.

In an example embodiment, signalling may be arranged between a macro eNB and a UE to indicate that the UE is or is not able to receive during the optional part of the pattern.

In an example embodiment, in order to reduce signalling overhead, a macro eNB may request a UE to clear the optional part of the muting pattern in its neighborhood. If this can be assumed to succeed almost always, the UE may not need to send signalling back when it has done it. Normally, when the macro eNB handles the error recovery, it may notice that the UE is actually encountering significantly more errors when receiving on an unactivated optional part than on a fixed part of the muting pattern. In another example embodiment, a macro eNB may configure a UE with a measurement pattern by which the UE can report separate channel quality indicators (CQI) for the fixed and optional parts of the muting pattern. Therefore, the network may readily know whether the UE has difficulty receiving during the unactivated optional part.

In an example embodiment, the macro eNB may activate the optional muting pattern in a HeNB by signalling the HeNB directly either over the air or using a signalling interface such as a X2 interface or an OAM interface.

In an example embodiment, a macro eNB may initiate a request to activate the optional part of the muting pattern for a UE. The request may be based on active traffic for the UE, other UEs' needs, a fixed part of the pattern not being enough for UEs in a coverage hole, an overall load situation, or other reasons. In an example embodiment, depending on the signaling interface between the macro eNB and the CSG HeNB, it may be possible for them to communicate directly and arrange the activation of the optional part of the muting pattern, after the UE has reported the identity of the strong interfering HeNB. In another example embodiment, the UE may handle the communication with the interfering HeNB(s) after the macro eNB sends the request to the UE to activate the optional part of the muting pattern. In such a case, the UE may not need to signal the macro eNB which exact HeNB(s) should be muted.

In an example embodiment, the optional part of the muting pattern is configured the same for multiple HeNBs and known by a macro eNB. If there are multiple interfering HeNBs to a UE, the UE may signal a request to more than one HeNBs that are interfering it substantially. In an example embodiment, the UE may know from handover measurements the strongest nearby HeNBs. Even though in certain circumstances, some of the nearby HeNBs may be inactive, the UE may still signal them the request if they are sufficiently close. Those HeNBs can simply acknowledge and continue not interfering, i.e., being inactive. Typically, there may be just one dominant interfering CSG HeNB, e.g., in the same apartment where the UE is. If there are more than one strong interfering CSG HeNBs, the UE may signal them in an order starting from the one with the strongest interference until the interference is reduced enough. In an example embodiment, the UE may compare the received downlink (DL) interference power and the RSRP of those CSG cells to determine the request order. FIGS. 2A and 2B illustrate the activation of the optional part of the muting pattern in accordance with an example embodiment of the invention. In FIG. 2A, a UE 202 is communicating with a macro eNB 201, while a CSG HeNB 203 is present nearby. The CSG HeNB 203 may be configured with a muting pattern and mute the fixed part of the pattern by default as shown as an example by the frame structure 211. The communication between the UE 202 and the macro eNB 201 may take advantage of the fixed muted subframes and the interference on the UE 202 from the HeNB 203 may be controlled at a satisfactory level.

In FIG. 2B, another UE 204 begins to communicate with the macro eNB 201. In a scenario where the UE 204 detects a need to activate the optional part of the muting pattern, e.g., when the UE 204 moves towards the HeNB 203 but does not have the access to the corresponding CSG, it may signal the HeNB 203 that the optional part of the muting pattern needs to be activated. Based on the received signaling, the HeNB 203 will activate the optional part as shown as an example by the frame structure 213.

Figure 3:
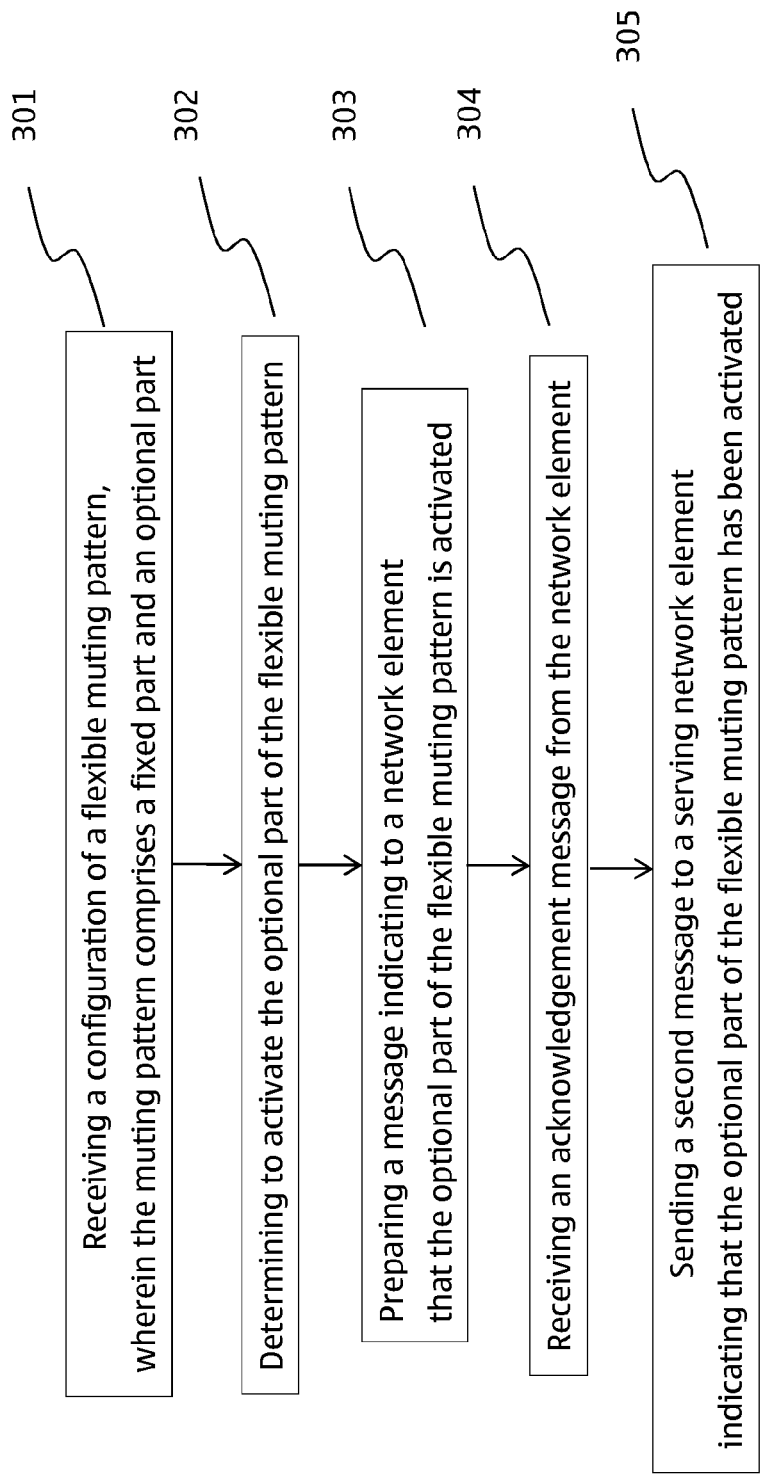
FIG. 3 illustrates a flow diagram of operating a user equipment according to an example embodiment of the invention.

FIG. 3 illustrates a flow diagram of operating a UE according to an example embodiment of the invention. At 301, a configuration of a flexible muting pattern is received. The muting pattern comprises a fixed part and an optional part. At 302, the UE determines to activate the optional part of the muting pattern. At 303, a message is prepared to indicate to a network element (NE) that the optional part of the flexible muting pattern is activated. In an example embodiment, the message may be sent by using a random access procedure. In an example embodiment, the message may be sent by introducing a new random access procedure message. In another example embodiment, the message is a radio resource control connection request message carrying a new defined value. Optionally, the UE may receive an acknowledgement message at 304 from the network element. Optionally, at 305, the UE may send a second message to a serving network element, e.g., a macro eNB, indicating that the optional part of the muting pattern has been activated.

Figure 4:
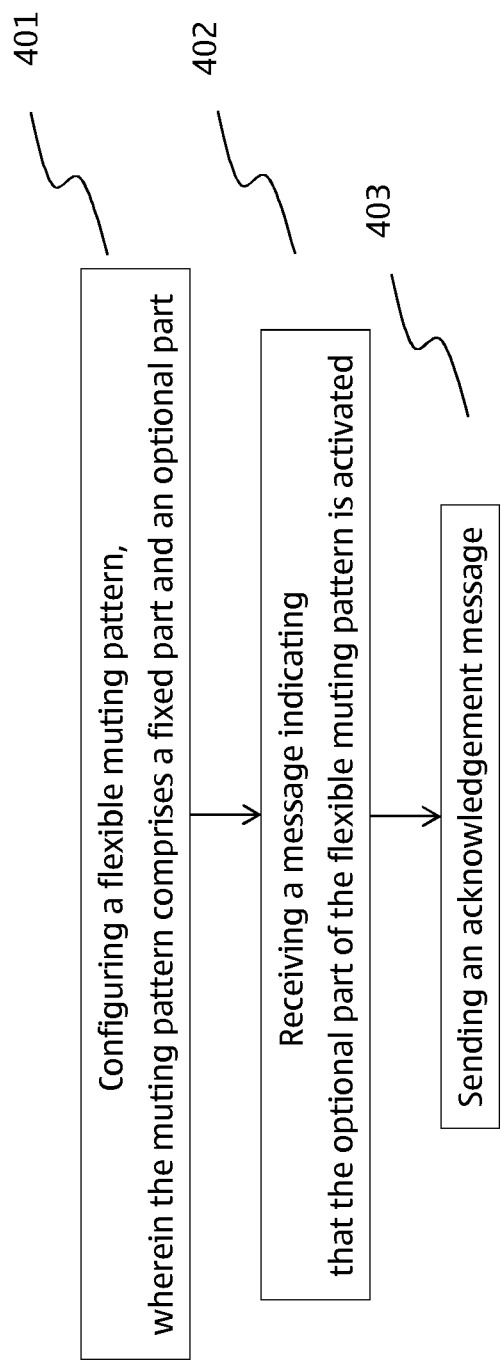
FIG. 4 illustrates a flow diagram of operating a home evolved NodeB (eNodeB) according to an example embodiment of the invention.

FIG. 4 illustrates a flow diagram of operating a HeNB according to an example embodiment of the invention. At 401, the HeNB configures a flexible muting pattern. The muting pattern comprises a fixed part and an optional part. At 402, the HeNB receives a message indicating that the optional part of the flexible muting pattern is activated. In an example embodiment, the message may be received by using a random access procedure between the HeNB and a UE. In an example embodiment, the message may be received by using a new random access procedure message. In another example embodiment, the message is a radio resource control connection request message carrying a new defined value sent from a UE. In another example embodiment, the message is received from a macro eNB serving a UE that needs to activate the optional part of the muting pattern. Optionally, the HeNB may send an acknowledgement message at 403.

Figure 5:
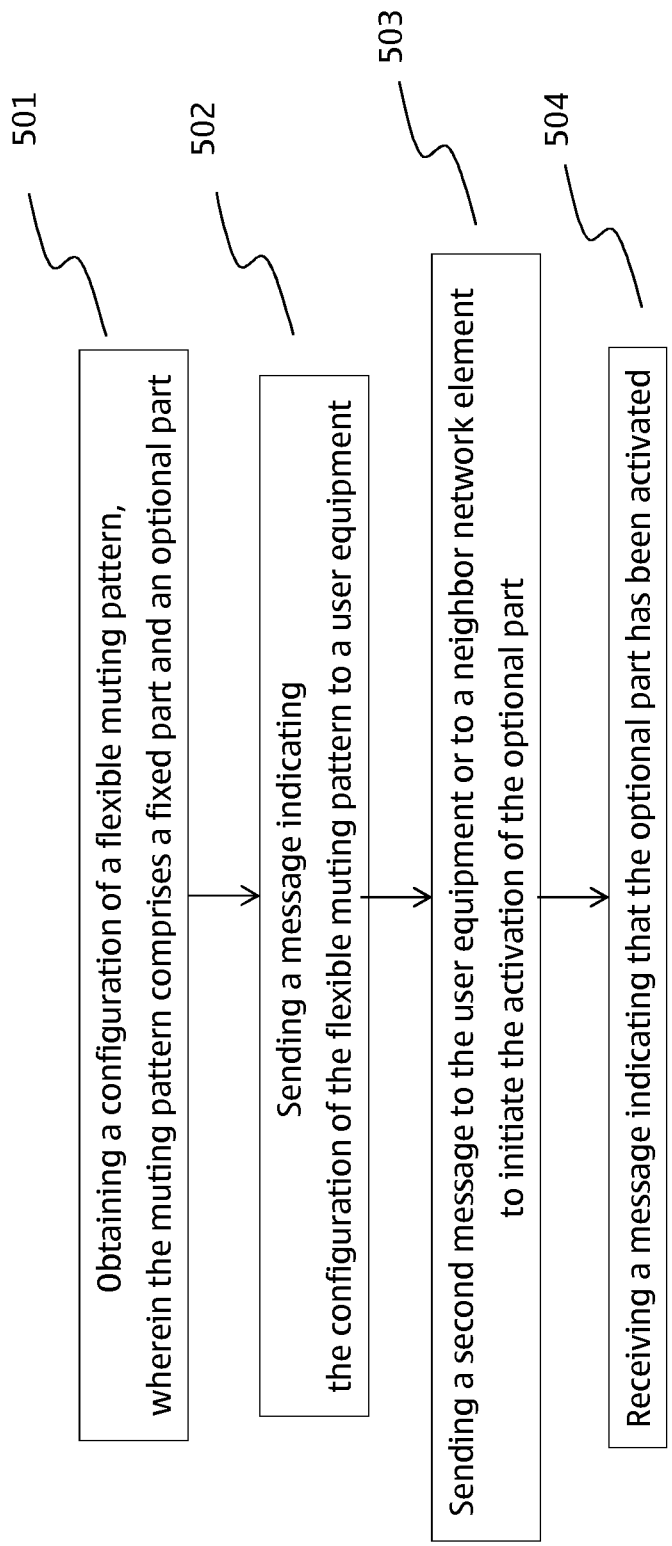
FIG. 5 illustrates a flow diagram of operating a macro eNodeB according to an example embodiment of the invention.

FIG. 5 illustrates a flow diagram of operating a macro eNB according to an example embodiment of the invention. At 501, the macro eNB obtains a configuration of a flexible muting pattern. The muting pattern comprises a fixed part and an optional part. The configuration may be determined by the macro eNB or may be indicated by an OAM entity. At 502, the macro eNB sends a message indicating the configuration of the flexible muting pattern to a UE. In an example embodiment, the macro eNB may optionally initiate the activation of the optional part by sending a second message at 503 to the UE or to a neighbor network element, e.g., a CSG HeNB, which yields significant interference on the UE. Optionally, at 504, the macro eNB may receive a message indicating that the optional part of the muting pattern has been activated.

Figure 6:
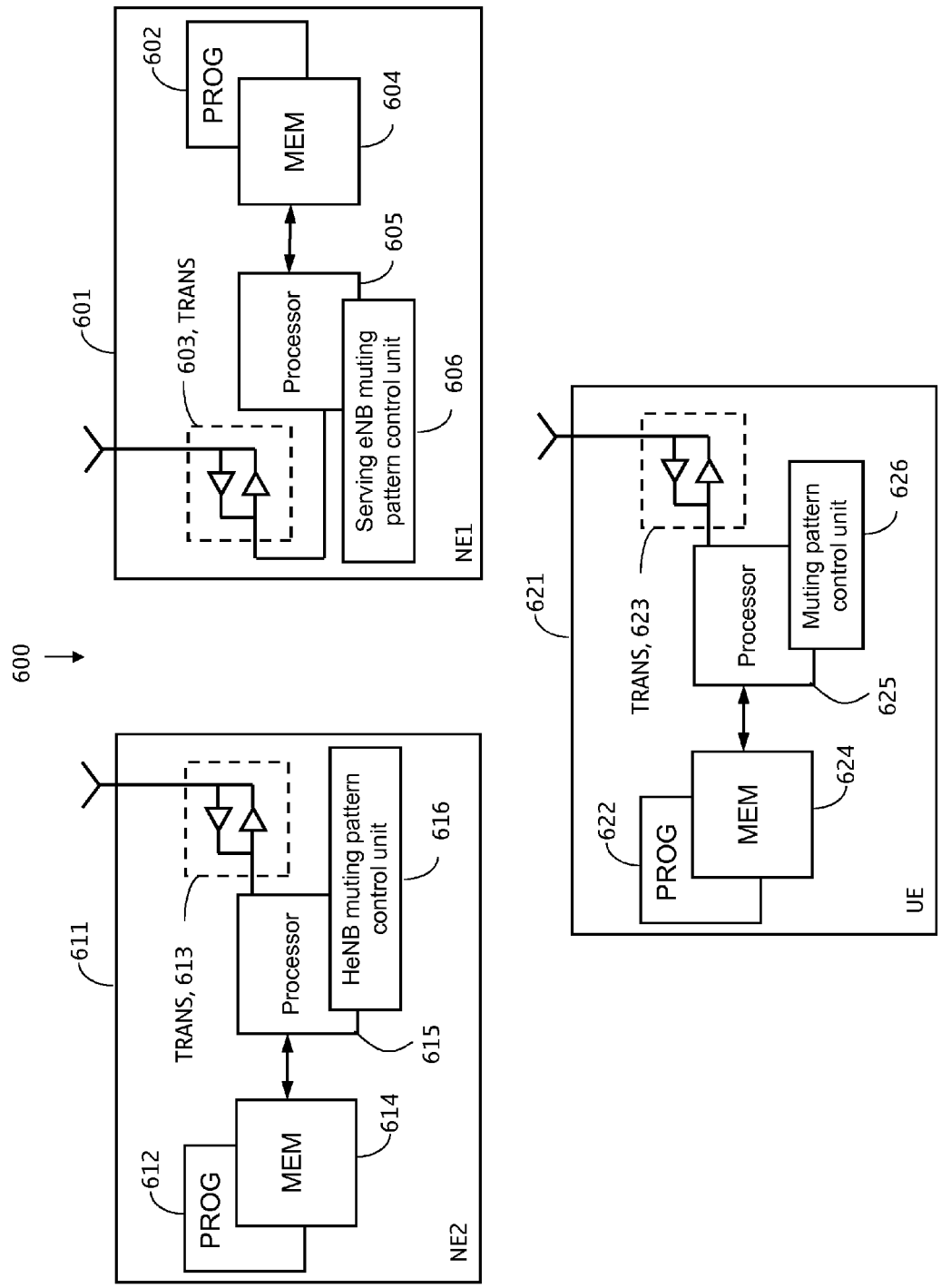
FIG. 6 illustrates a simplified block diagram of various example apparatuses that are suitable for use in practicing various example embodiments of this invention.

Reference is made to FIG. 6 for illustrating a simplified block diagram of various example apparatuses that are suitable for use in practicing various example embodiments of this invention. In FIG. 6, a wireless network 600 is adapted for communication with a UE 621 via a network element NE1 601, such as macro eNB 105 or 201 of FIGS. 1 and 2A-2B, respectively. A second network element NE2 611, e.g., HeNB 107 or 203 of FIGS. 1 and 2A-2B, respectively, is also deployed in the wireless network 600. The UE 621 may also communicate with NE2 611 in some way depending on the accessibility of NE2. The UE 621 includes a processor 625, a memory (MEM) 6244 coupled to the processor 625, and a suitable wireless interface, such as transceiver (TRANS) 623 (having a transmitter (TX) and a receiver (RX)) coupled to the processor 625. The MEM 624 stores a program (PROG) 622. The TRANS 623 is for bidirectional wireless communications with the NE1 601 and the NE2 611.

The NE1 601 includes a processor 605, a memory (MEM) 604 coupled to the processor 605, and a suitable wireless interface, such as transceiver (TRANS) 603 (having a transmitter (TX) and a receiver (RX)) coupled to the processor 605. The MEM 604 stores a program (PROG) 602. The TRANS 603 is for bidirectional wireless communications with the UE 621. The NE1 601 is coupled to one or more external networks or systems, which is not shown in this figure.

The NE2 611 includes a processor 615, a memory (MEM) 614 coupled to the processor 615, and a suitable wireless interface, such as transceiver (TRANS) 613 (having a transmitter (TX) and a receiver (RX)) coupled to the processor 615. The MEM 614 stores a program (PROG) 612. The TRANS 613 is capable for bidirectional wireless communications with the UE 621. The UE1 601 and the UE2 611 may communicate with each other based on certain protocol or interface, or through a gateway, which is not shown in this figure.

As shown in FIG. 6, the UE 621 may further include a muting pattern control unit 626 for receiving a configuration of a flexible muting pattern, wherein the muting pattern comprises a fixed part and an optional part, determining to activate the optional part of the flexible muting pattern, and preparing a message indicating to a network element that the optional part of the flexible muting pattern is activated. The unit 626, together with the processor 625 and the PROG 622, is configured to perform muting pattern control in accordance with various example embodiments of the invention, as described herein.

As shown in FIG. 6, the NE2 611 may further include a HeNB muting pattern control unit 616 for configuring a flexible muting pattern, wherein the muting pattern comprises a fixed part and an optional part, and receiving a message indicating that the optional part of the flexible muting pattern is activated. The unit 616, together with the processor 615 and the PROG 612, may be utilized by the NE2 611 in conjunction with various example embodiments of the invention, as described herein.

As shown in FIG. 6, the NE1 601 may further include a serving eNB muting pattern control unit 606 for obtaining a configuration of a flexible muting pattern, wherein the muting pattern comprises a fixed part and an optional part, and sending a message indicating the configuration of the flexible muting pattern to a user equipment. The unit 606, together with the processor 605 and the PROG 602, may be utilized by the NE1 601 in conjunction with various example embodiments of the invention, as described herein.

At least one of the PROGs 602, 612 and 622 is assumed to include program instructions that, when executed by the associated processor, enable the electronic apparatus to operate in accordance with the example embodiments of this disclosure, as discussed herein.

In general, the various example embodiments of the apparatus 621 can include, but are not limited to, cellular phones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The example embodiments of this disclosure may be implemented by computer software or computer program code executable by one or more of the processors 605, 615 and 625 of the NE1 601, the NE2 611 and the UE 621, or by hardware, or by a combination of software and hardware.

The MEMs 604, 614 and 624 may be of any type suitable to the local technical environment and may be implemented using any suitable data storage technology, such as semiconductor-based memory devices, flash memory, magnetic memory devices and systems, optical memory devices and systems, fixed memory and removable memory, as non-limiting examples. The processors 605, 615 and 625 may be of any type suitable to the local technical environment, and may include one or more of general purpose computers, special purpose computers, microprocessors, digital signal processors (DSPs) and processors based on multi-core processor architecture, as non-limiting examples. The wireless interfaces (e.g., RF transceivers 603, 613 and 623) may be of any type suitable to the local technical environment and may be implemented using any suitable communication technology such as individual transmitters, receivers, transceivers or a combination of such components.

Without in any way limiting the scope, interpretation, or application of the invention, a technical effect of one or more of the example embodiments disclosed herein may be configuring a muting pattern flexibly based on need. This helps to reduce the waste of channel capacity, caused by reserving too many fixed muting subframes, and to coordinate the interference towards a macro UE by a CSG HeNB.

Embodiments of the present invention may be implemented in software, hardware, application logic or a combination of software, hardware and application logic. The software, application logic and/or hardware may reside on an apparatus such as a user equipment, a NodeB or other mobile communication devices. If desired, part of the software, application logic and/or hardware may reside on a macro eNodeB/base station 601, part of the software, application logic and/or hardware may reside on a home eNodeB/base station 611, part of the software, application logic and/or hardware may reside on a user equipment 621, and part of the software, application logic and/or hardware may reside on another chipset or integrated circuit. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device. A computer-readable medium may comprise a computer-readable storage medium that may be any media or means that can contain or store the instructions for use by or in connection with an instruction execution system, apparatus, or device.

Although various aspects of exemplary and non-limiting embodiments of the invention are set out in the independent claims, other aspects of the exemplary and non-limiting embodiments of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention.

For example, while the example embodiments have been described above in the context of the LTE system, it should be appreciated that the example embodiments of this invention are not limited for use with only this one particular type of wireless communication system.

Further, the various names used for the described parameters are not intended to be limiting in any respect, as these parameters may be identified by any suitable names.

If desired, the different functions discussed herein may be performed in a different order and/or concurrently with each other. Furthermore, if desired, one or more of the above-described functions may be optional or may be combined.

As such, the foregoing description should be considered as merely illustrative of the principles, teachings and example embodiments of this invention, and not in limitation thereof.

What is claimed is:

1. A method, comprising:
receiving at a user equipment a configuration of a flexible muting pattern, wherein the flexible muting pattern comprises a fixed part and an optional part, wherein during the fixed part of the flexible muting pattern a network element is triggered to always be muted;
determining at the user equipment to activate the optional part of the flexible muting pattern, when the optional part of the flexible muting pattern is activated the network element is triggered to be muted, and the optional part is activated based on the determination of the user equipment; and
sending from the user equipment a message informing the network element to activate the optional part of the flexible muting pattern.

2. The method as claimed in claim 1, further comprising:
preparing a message indicating to the network element that the optional part of the flexible muting pattern is activated.

3. The method as claimed in claim 2, further comprising:
sending the message to the network element by one of using a random access procedure;
introducing a new random access procedure message; and
introducing a new value in a radio resource control connection request message.

4. The method as claimed in claim 2, further comprising repeating sending the message to extend the duration of the activation of the optional part.

5. The method as claimed in claim 2, further comprising receiving an acknowledgement message from the network element.

6. The method as claimed in claim 1, further comprising:
sending a second message to a serving network element indicating that the optional part of the flexible muting pattern has been activated.

7. The method as claimed in claim 6, further comprising sending separate channel quality measurements for the fixed and optional parts to the serving network element.

8. The method as claimed in claim 1, wherein determining to activate the optional part comprises at least one of: measuring the interference from a neighboring network element, observing the quality of a received traffic, and receiving a request to activate the optional part from the serving network element.

9. The method as claimed in claim 1, further comprising:
determining whether to activate the optional part of the flexible muting pattern for at least one other network element; and
preparing a message indicating to the at least one other network element that the optional part of the flexible muting pattern is activated.

10. An apparatus, comprising:
at least one processor;
and at least one memory including computer program code,
wherein the at least one memory and the computer program code are configured to, with the at least one processor, cause the apparatus at least to:
receive at a user equipment a configuration of a flexible muting pattern, wherein the flexible muting pattern comprises a fixed part and an optional part, wherein during the fixed part of the flexible muting pattern a network element is triggered to always be muted; and
determine at the user equipment to activate the optional part of the flexible muting pattern, when the optional part of the flexible muting pattern is activated the network element is triggered to be muted, and the optional part is activated based on the determination of the user equipment; and
send from the user equipment a message informing the network element to activate the optional part of the flexible muting pattern.

11. The apparatus as claimed in claim 10, wherein the at least one memory and the computer program code configured to, with the at least one processor, cause the apparatus to prepare a message indicating to the network element that the optional part of the flexible muting pattern is activated.

12. The apparatus as claimed in claim 11, wherein the at least one memory and the computer program code configured to, with the at least one processor, cause the apparatus to send the message to the network element by one of:
using a random access procedure,
introducing a new random access procedure message, and
introducing a new value in a radio resource control connection request message.

13. The apparatus as claimed in claim 11, wherein the at least one memory and the computer program code are configured to, with the at least one processor, cause the apparatus to repeat sending the message to extend the duration of the activation of the optional part.

14. The apparatus as claimed in claim 11, wherein the at least one memory and the computer program code are configured to, with the at least one processor, cause the apparatus to receive an acknowledgement message from the network element.

15. The apparatus as claimed in claim 10, wherein the at least one memory and the computer program code configured to, with the at least one processor, cause the apparatus to send a second message to a serving network element indicating that the optional part of the flexible muting pattern has been activated.

16. The apparatus as claimed in claim 15, wherein the at least one memory and the computer program code are configured to, with the at least one processor, cause the apparatus to send separate channel quality measurements for the fixed and optional parts to the serving network element.

17. The apparatus as claimed in claim 10, wherein the optional part is determined to be activated by at least one of: measuring the interference from a neighboring network element, observing the quality of a received traffic, and receiving a request to activate the optional part from the serving network element.

18. The apparatus as claimed in claim 10, wherein the at least one memory and the computer program code are configured to, with the at least one processor, cause the apparatus to:
determine whether to activate the optional part of the flexible muting pattern for at least one other network element; and
prepare a message indicating to the at least one other network element that the optional part of the flexible muting pattern is activated.

19. A method, comprising:
obtaining a configuration of a flexible muting pattern, wherein the flexible muting pattern comprises a fixed part and an optional part, wherein during the fixed part of the flexible muting pattern a network element is always muted, and wherein the optional part is activated upon a request of a user equipment, and when the optional part of the flexible muting pattern is activated the network element is muted; and sending a message indicating the configuration of the flexible muting pattern to the user equipment.

20. The method as claimed in claim 19, further comprising sending a second message to the user equipment or to a neighbor network element to initiate the activation of the optional part.

\* \* \* \* \*